US008553807B2

(12) United States Patent  (10) Patent No.: US 8,553,807 B2
Morris et al.  (45) Date of Patent: Oct. 8, 2013

(54) METHODS AND SYSTEMS FOR PROGRAMMABLE DIGITAL UP-CONVERSION

(75) Inventors: Bradley John Morris, Ottawa (CA); Arthur Thomas Gerald Fuller, Carp (CA)

(73) Assignee: Apple Inc., Cupertino, CA (US)

( * ) Notice: Subject to any disclaimer, the term of this patent is extended or adjusted under 35 U.S.C. 154(b) by 1144 days.

(21) Appl. No.: 12/254,332

(22) Filed: Oct. 20, 2008

(65) Prior Publication Data

US 2010/0098191 A1  Apr. 22, 2010

(51) Int. Cl.
 *H04L 27/00*  (2006.01)
(52) U.S. Cl.
 USPC .......................................... 375/316; 375/322
(58) Field of Classification Search
 USPC .......................... 375/295–315; 455/189.1, 91
 See application file for complete search history.

(56) References Cited

U.S. PATENT DOCUMENTS

| | | | |
|---|---|---|---|
| 6,611,570 B1 | 8/2003 | Subramanian | |
| 6,810,090 B1 | 10/2004 | Perlow | |
| 6,987,953 B2 * | 1/2006 | Morris et al. | 455/102 |
| 2003/0035493 A1 * | 2/2003 | Mollenkopf | 375/295 |
| 2003/0210746 A1 | 11/2003 | Asbeck et al. | |
| 2004/0192229 A1 | 9/2004 | Morris et al. | |

FOREIGN PATENT DOCUMENTS

| | | |
|---|---|---|
| EP | 0817369 A2 | 1/1998 |
| EP | 1 168 632 A1 | 1/2002 |
| WO | 99/25104 A1 | 5/1999 |

OTHER PUBLICATIONS

International Search Report from PCT Application No. PCT/CA2009/001495 dated Jan. 28, 2010.
U.S. Appl. No. 12/214,856, filed Jun. 23, 2008, Morris et al.
European Search Report for corresponding European Patent Application No. 09821470.3, issued Sep. 14, 2012, 8 pages.

* cited by examiner

*Primary Examiner* — Sam K Ahn
*Assistant Examiner* — Janice Tieu
(74) *Attorney, Agent, or Firm* — Meyertons, Hood, Kivlin, Kowert & Goetzel, P.C.

(57) ABSTRACT

Methods and apparatus are described herein that make use of complex tuning, the inherently repetitive nature of sampled signals, and programmable digital filtering to create a flexible digital up-conversion system that utilizes a digital-to-analog converter (DAC) with a fixed effective sample rate while still being adapted for tunability over a wide frequency range. With a knowledge of the fixed effective sample rate of the DAC and a desired frequency of up-conversion and combining complex tuning at baseband and up-sampling by a factor of N with a programmable passband filter configured to select one of a plurality of signal images resulting from the up-sampling, it is possible to translate a baseband input signal to a wide range of frequencies above or below $F_s$, without changing the sampling rate of the fixed rate DAC used in the up-conversion process.

21 Claims, 8 Drawing Sheets

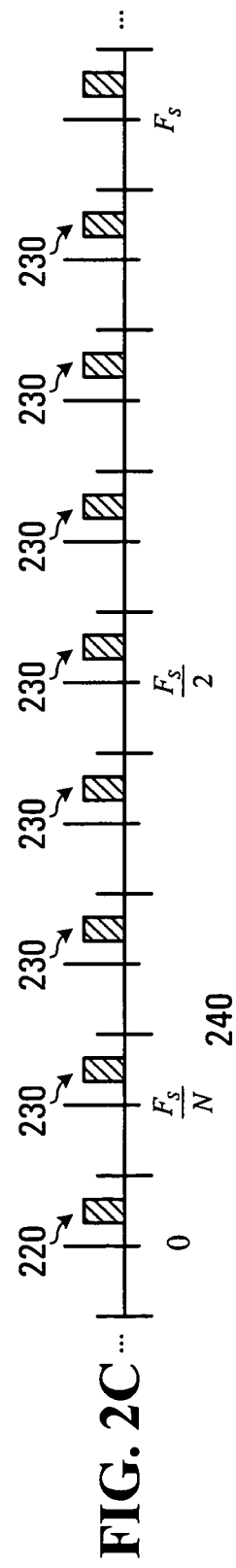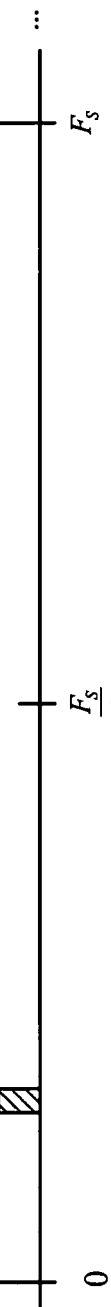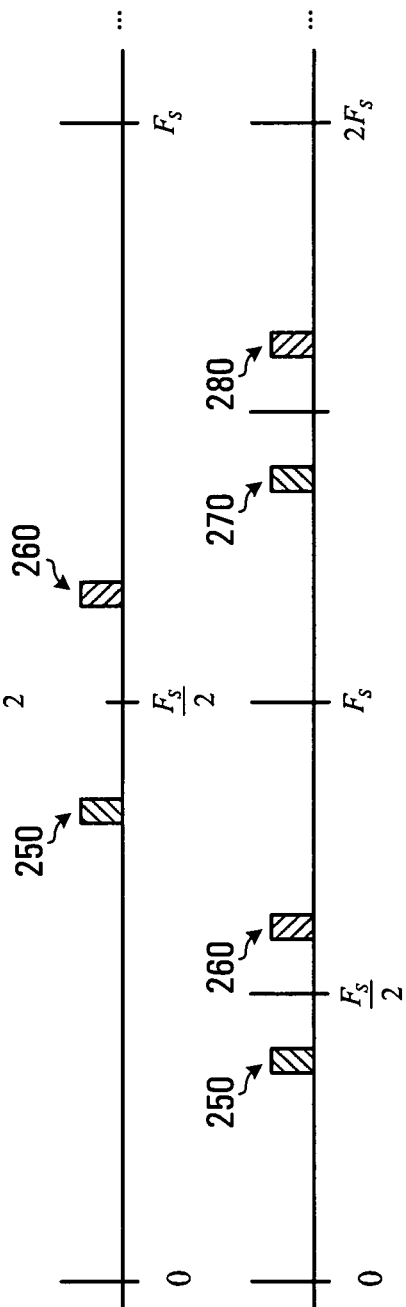

METHODS AND SYSTEMS FOR PROGRAMMABLE DIGITAL UP-CONVERSION

FIELD OF THE INVENTION

The invention relates to digital communication systems, in particular to up-conversion of signals.

BACKGROUND OF THE INVENTION

Traditionally, baseband to radio frequency (RF) up-conversion is performed in the analog domain with one of three types of architectures: heterodyne; super-heterodyne; or direct conversion.

In heterodyne or super-heterodyne architectures the baseband signal can be either complex, utilizing analog quadrature modulation, or real, utilizing digital quadrature modulation, for modulating the baseband signal to a low intermediate frequency. In direct conversion architectures the baseband signal is complex and utilizes analog quadrature modulation.

Analog up-conversion and previous attempts at digital up-conversion have generally been frequency dependent, that is the up-conversion techniques operate over a small frequency band. Therefore, the same design will not operate effectively at other frequency bands. For example, an up-converter designed for operation at 800 MHz will not operate properly at 450 MHz, 1.5 GHz or 1.9 GHz.

One disadvantage of analog up-conversion is that it is subject to issues related to analog variability such as, but not limited to, component to component variability, temperature variability, voltage variability and variability due to aging. Another disadvantage of analog up-conversion is inflexibility, as an analog up-conversion architecture needs to be designed for specific frequency bands. Therefore, it is not possible to easily convert a radio for use in an alternate frequency band without physically replacing an up-converter in the radio, as well as other components that may be frequency dependent, with a newly designed up-converter for the alternate band, or have multiple up-converters each capable of operating in a different frequency band. Either option adds an increase to the cost of a system.

SUMMARY OF THE INVENTION

According to a first aspect of the invention, there is provided a method of digitally up-converting a discrete-time baseband signal to a desired frequency comprising: selecting a fixed effective sampling rate $F_s$ for a digital-to-analog converter (DAC) used in up-converting the discrete-time baseband signal; performing complex tuning on the discrete-time baseband signal to produce a complex tuned discrete-time signal which is translated in the frequency domain; up-sampling by N, N>=2, to produce an up-sampled discrete-time signal having a frequency domain representation that includes a plurality of equally spaced apart images; filtering the up-sampled discrete-time signal to select at least one image of the plurality of images of the discrete-time signal to produce a filtered discrete-time signal; converting the filtered discrete-time signal that includes the at least one image to a continuous-time signal using the DAC; and filtering the continuous-time signal to select an image located at the desired frequency in the frequency domain; wherein an amount of tuning used in the performing complex tuning step and filter coefficients used in the filtering of the discrete-time signal step are each determined as a function of the fixed effective sampling rate of the DAC and the desired frequency of up-conversion.

In some embodiments, the method further comprises: determining the amount of tuning for performing complex tuning; determining filter coefficients used in the filtering of the discrete-time signal.

In some embodiments, the method further comprises: performing quadrature modulation subsequent to complex tuning.

In some embodiments, performing quadrature modulation subsequent to complex tuning comprises one of: performing digital quadrature modulation prior to converting the filtered discrete-time signal to a continuous-time signal; and performing analog quadrature modulation subsequent to converting the filtered discrete-time signal to a continuous-time signal.

In some embodiments, performing quadrature modulation subsequent to complex tuning comprises: performing digital quadrature modulation subsequent to filtering the up-sampled discrete-time signal.

In some embodiments filtering the continuous-time signal comprises: selecting an image from the continuous-time signal located at a frequency between 0 and $F_s$; or selecting an image from the continuous-time signal located at a frequency above $F_s$.

In some embodiments, up-sampling the discrete-time signal by N and filtering the up-sampled discrete-time signal comprises performing the up-sampling and filtering using polyphase techniques.

In some embodiments, up-sampling the discrete-time signal by N and filtering the up-sampled discrete-time signal comprises performing the up-sampling and filtering using polyphase techniques, and wherein: performing digital quadrature modulation comprises using a quadrature modulation frequency which is equal to the fixed effective sampling rate of the DAC divided by an integer.

In some embodiments, the integer has an integer relation to N.

In some embodiments, performing complex tuning on the discrete-time baseband signal comprises: performing M times in succession, where M>=2, the first time on the discrete-time baseband signal and each subsequent time of the M times on a resulting discrete-time signal of each previous occurrence: complex tuning of a discrete-time signal to produce an interim tuned discrete-time signal; up-sampling the interim tuned discrete-time signal to produce an up-sampled interim tuned discrete-time signal; filtering the up-sampled interim tuned discrete-time signal to select an image and produce a filtered interim tuned discrete-time signal; performing complex tuning on the Mth filtered interim tuned discrete-time signal to produce the up-sampled discrete-time signal.

In some embodiments, the method further comprises: resampling at least one of the discrete-time baseband signal, the complex tuned discrete-time signal, the up-sampled discrete-time signal or the filtered discrete-time signal to be an integer sub-multiple of the fixed effective sampling rate of the DAC.

According to a second aspect of the invention, there is provided an apparatus for performing digital up-conversion of a discrete-time baseband signal to a desired frequency, the apparatus comprising: a digital-to-analog converter (DAC) having a fixed effective sampling rate that is selected to be $F_s$; a complex tuner configured to tune the discrete-time baseband signal and produce a complex tuned discrete-time signal; a digital up-sample by N, N>=2, up-sampler configured to produce an up-sampled discrete-time signal, which in the frequency domain includes a plurality of equally spaced apart images; an image selection filter configured to select at least one image of the plurality of images and produce a filtered discrete-time signal that is converted by the DAC from a discrete-time signal to a continuous-time signal; a post-DAC filter configured to receive the continuous-time signal and select an image located at the desired frequency in the frequency domain; wherein determining an amount of tuning used in the complex tuner and determining filter coefficients used in the image selection filter are each determined as a function of the selected fixed effective sampling rate of the DAC and the desired frequency of up-conversion.

In some embodiments, the complex tuner and the image selection filter are configurable by changing operational parameters to digitally up-convert the discrete-time baseband signal to a desired frequency in any one of a plurality of communication bands.

In some embodiments, the digital up-sample by N up-sampler and the image selection filter are implemented in a manner configured to perform polyphase techniques.

In some embodiments, the apparatus further comprises a quadrature modulator configured to perform quadrature modulation subsequent to the complex tuner.

In some embodiments, the quadrature modulator comprises one of: a digital quadrature modulator configured to perform digital quadrature modulation prior to the DAC; and an analog quadrature modulator configured to perform analog quadrature modulation subsequent to the DAC.

In some embodiments, the digital up-sample by N up-sampler and the image selection filter are implemented in a manner configured to perform polyphase techniques; and wherein the quadrature modulator is configured to operate at a quadrature modulation frequency which reduces the complexity of the implementation.

In some embodiments, the complex tuner is a distributed complex tuner having M, M>=2, complex baseband tuners, M−1 digital up-samplers and M−1 image selection filters: wherein M−1 of the M baseband tuners, the M−1 up-sample by K up-samplers and the M−1 image selection filters are arranged in groups of a baseband tuner, a digital up-sampler and an image selection filter, each group configured to perform: complex tuning of a discrete-time signal to produce an interim tuned discrete-time signal; up-sampling of the interim tuned discrete-time signal, to produce an up-sampled interim tuned discrete-time signal; and filtering of the up-sampled interim tuned discrete-time signal to select an image and produce a filtered interim tuned discrete-time signal; the first group performing on the discrete-time baseband signal and each subsequent group performing on the resulting filtered interim tuned discrete-time signal of each previous group; and the Mth complex tuner configured to: receive the M−1th filtered interim tuned discrete-time signal; and perform complex tuning of the M−1th filtered interim tuned discrete-time signal to produce the complex tuned discrete-time signal.

In some embodiments, the apparatus further comprises a rate change component adapted to resample at least one of the discrete-time baseband signal, the complex-tuned discrete-time signal, the up-sampled discrete-time signal or the filtered discrete-time signal to be an integer sub-multiple of the fixed effective sampling rate of the DAC.

According to a third aspect of the invention, there is provided a method of reconfiguring a digital up-converter to operate in a different frequency band comprising: determining a tuning frequency for use in performing complex tuning of a discrete-time baseband signal to produce a complex-tuned discrete-time signal; determining filter coefficients for use in filtering an up-sampled discrete-time signal to isolate at least one image in the frequency domain of a plurality of images of the up-sampled discrete-time signal and produce a filtered discrete-time signal, the up-sampled discrete-time signal resulting from up-sampling the complex tuned time-discrete signal; wherein determining a tuning frequency and determining filter coefficients are each determined as a function of a fixed effective sampling rate of a digital-to-analog converter (DAC) used in the digital up-converter and the desired frequency of up-conversion of the discrete-time baseband signal.

In some embodiments, the method further comprises: replacing the tuning frequency and filter coefficients currently being used in the digital up-converter with at least one of the tuning frequency and filter coefficients determined in the respective determining steps.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described with reference to the attached drawings in which:

FIGS. 2A-2F are frequency domain illustrations of a signal processed according to an embodiment of the invention;

DETAILED DESCRIPTION OF THE EMBODIMENTS OF THE INVENTION

Figure 1:
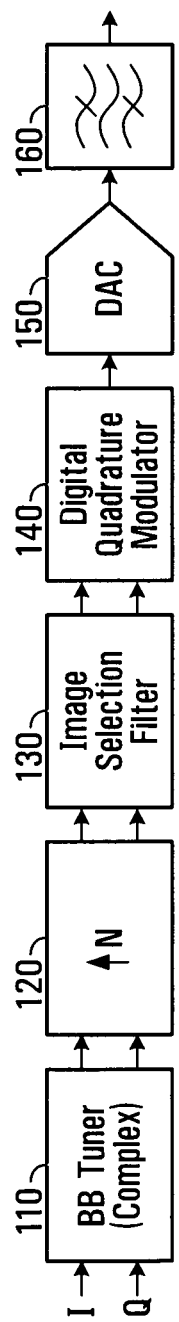
FIG. 1 is a block diagram of an apparatus for digitally up-converting a signal according to an embodiment of the invention.

Methods and apparatus are described herein that make use of complex tuning, the inherently repetitive nature of sampled signals, and programmable digital filtering to create a flexible digital up-conversion system that utilizes a digital-to-analog converter (DAC) with a fixed sample rate, more accurately known as an update rate as this is the rate at which the DAC information and output are changed or updated, while still allowing for tunability over a wide frequency range.

Methods and apparatus described herein take advantage of the sampled nature of digital signals. Specifically, when digitally representing a signal with a sampling frequency of $F_s$, the spectrum between 0 and $F_s$ is repeated infinitely in both directions, in the positive frequency direction between $F_s$ and $2F_s$, $2F_s$ and $3F_s$, etc. and in the negative frequency direction between 0 and $-F_s$, $-F_s$ and $-2F_s$, $-2F_s$ and $-3F_s$, etc. A similar repetition of a signal spectrum occurs when the signal is up-sampled or when the signal is converted from a digital signal to an analog signal.

Although the nature of sampled data systems is well understood, the inventive methods and apparatus take advantage of this to achieve a digital tunable up-converter that is capable of being tuned over a wide frequency range while maintaining a fixed effective sample rate of the DAC in the digital tunable up-converter.

Digital frequency tunability in an up-converter which includes the DAC with a fixed effective sampling rate $F_s$ is desirable for several reasons. Designing an analog radio with a flexible DAC sample rate is a difficult task due to the complexity required to keep track of various mixing products resulting from the flexible DAC sample rate and thus ensure that, in the frequency domain, no undesirable images resulting from the mixing products interfere with the desired image. Utilizing a fixed rate DAC, on the other hand, results in a less complex overall design for a radio, in part due to selecting an effective DAC sample rate to minimize undesirable mixing products. Furthermore, designing an analog radio with a flexible DAC sample rate typically entails undesirable performance trade-offs, which result in redesigning the radio for each new frequency band or variant.

Images created by up-sampling a signal, an example of which is sampling rate expansion, are fundamental to sampled data systems, but the positioning of the images is not always at an optimal or appropriate location. By combining complex tuning at baseband and up-sampling by a factor of N with a programmable passband filter configured to select at least one of N signal images in a given bandwidth resulting from the up-sampling, it is possible to translate a baseband input signal to a wide range of frequencies above or below $F_s$, for example in the frequency spectrum from 0 to $F_s$, $F_s$ to $2F_s$, $2F_s$ to $3F_s$, etc. without changing the sampling rate of the fixed rate DAC.

An example of an apparatus for up-converting a baseband signal to a desired frequency will now be described with reference to FIG. 1 and the frequency domain representation of signals in FIGS. 2A to 2F, which illustrate how a signal input to the apparatus is operated on at particular stages within the apparatus.

FIG. 1 includes a complex baseband tuner (BB Tuner (Complex)) 110, a digital up-sampler 120, an image selection filter 130, a digital quadrature modulator 140, a digital-to-analog converter (DAC) 150 and a post-DAC filter 160.

In operation, for the illustrated example, the signals operated upon by components 110, 120, 130, 140 and 150 are discrete time signals and the signal output by DAC 150 and operated on by the post-DAC filter 160 is a continuous time signal. The complex baseband tuner 110 receives a complex baseband signal having a sample rate $F_s/N$ as an input to be frequency translated to a desired frequency, where $F_s$ is the effective sampling rate of the DAC 150 and N is an up-sampling rate employed by the digital up-sampler 120. In some embodiments, the complex baseband signal may not have a sample rate $F_s/N$, but the signal can be resampled to be $F_s/N$, as will be described below. FIG. 2A is a frequency spectrum representation of the baseband signal 210 centered around 0 MHz (DC) prior to being tuned to another frequency. The complex baseband signal may be In-phase (I) and Quadrature (Q) digital inputs that each include a stream of samples representing at least one digital value. The complex baseband tuner 110 performs complex tuning on the baseband signal to generate a tuned complex signal. The tuning essentially amounts to translating the frequency of the baseband signal within a limited range between $-F_s/2N$ and $F_s/2N$. For example, in its simplest form complex tuning is performed by mixing the complex baseband signal with a given time-varying phase shift. FIG. 2B is a frequency spectrum representation of the baseband signal 220 after it has been tuned to a different frequency.

In some embodiments, the baseband complex tuner 110 is programmable such that providing the baseband complex tuner with different operating parameter information configures the baseband complex tuner to operate in a different manner. For example, when the baseband complex tuner is provided with different operating parameters, the baseband complex tuner is able to tune an input signal to a different frequency than was previously being tuned to.

The complex baseband tuner can be designed to process signals with bandwidth and tunability parameters which are implementation specific. More generally, the baseband signal can be tuned anywhere in the frequency domain between $-F_s/2N$ and $F_s/2N$. As the baseband input signal is complex there is no issue if the signal straddles $-F_s/2N$ or $F_s/2N$.

A particular example of a complex baseband tuner is described in U.S. patent application Ser. No. 12/214,856 entitled "Cordic Based Complex Tuner with Exact Frequency Resolution" filed on Jun. 23, 2008, which is assigned to the assignee of the present application, and is hereby incorporated by reference in its entirety.

In the illustrated example, the digital up-sampler 120 up-samples an output of the complex baseband tuner 110 by N, where N>=2. Up-sampling the tuned complex baseband signal by a value of N produces a discrete time signal having a sampling rate of $F_s$, which is equal to the sampling rate of the DAC. The frequency domain representation of the signal has N equally spaced apart images of the tuned complex baseband signal between DC and the fixed sampling rate $F_s$ of the DAC, as shown in FIG. 2C. In FIG. 2C, the value of N is 8, resulting in 8 images of the signal, the original tuned baseband signal 220 and 7 replicated images 230, between DC and $F_s$. In some embodiments, the up-sampling is performed by inserting N-1 zeros between the samples of the tuned complex signal to create spectral repetition. However, up-sampling is not limited to inserting N-1 zeros between the samples. In other embodiments alternative up-sampling techniques are contemplated.

The image selection filter 130 is configured for receiving an output of the digital up-sampler 120 and selecting one of the N images of the tuned complex baseband signal output by the digital up-sampler 120. The image selection filter 130 receives a discrete time signal having an effective sampling rate of $F_s$. Considering the frequency domain representation of the signal, the image selection filter 130 isolates a desired image in the frequency domain by attenuating all undesired images. In some embodiments, the input signal is complex and the image selection filter 130 is configured to operate on a complex signal such that there is no symmetry of the signal about $F_s/2$ in the frequency domain, which may otherwise result in interference.

The image selection filter may be a real filter or a complex filter. Implementation of the image selection filter as a complex filter or as a real filter is situation specific, but it is to be understood that the respective types of filters (i.e. complex or real) have different performance capabilities that should be considered when selecting the type of filter. By way of example, FIG. 2D illustrates the frequency spectrum between DC and $F_s$ and shows that the second image 240 of the N images between 0 and Fs has been selected and the others attenuated.

In some embodiments, the image selection filter 130 is programmable such that providing the image selection filter 130 with different filter coefficients configures the image selection filter 130 to operate in a different manner. For example, when the image selection filter is provided with different filter coefficients which produce a different filter response, the image selection filter is able to select an image at a different location in the frequency spectrum.

The digital quadrature modulator 140 receives a discrete-time signal output from the image selection filter 130 and quadrature modulates the signal. In the frequency domain, this process results in translating the selected image of the discrete-time signal output by of the image selection filter 130 and converting the complex signal to a real signal. FIG. 2E shows an example of the frequency spectrum output from the digital quadrature modulator 140 when quadrature modulation is applied to the discrete-time signal including the selected second image of FIG. 2D. The modulation frequency $f_{qmod}$ used in the illustrative example of FIG. 1 is equal to $F_s/4$. As a result of $f_{qmod}$, the selected second image of FIG. 2D is frequency translated by $F_s/4$, indicated by reference 250, as illustrated in FIG. 2E. Furthermore, because the quadrature modulation produces a real signal, a reversed (flipped) image of the quadrature modulated shift image is produced, indicated by reference 260.

A Nyquist zone is defined as having a bandwidth of $F_s/2$ and the frequency spectrum includes an infinite number of such zones. For example, in the positive frequency domain a first Nyquist zone is from DC to $F_s/2$, a second Nyquist zone is from $F_s/2$ to $F_s$, a third Nyquist zone is from $3F_s/2$, a fourth Nyquist zone is from $3F_s/2$ to $2F_s$ etc. In FIG. 2E, the translated image 250 is located in the first Nyquist zone and the reversed image 260 of the translated image is located in the second Nyquist zone.

While a digital quadrature modulator may be preferable for reasons that result in reduced complexity, the use of an analog quadrature modulator is also contemplated, as will be discussed below.

The DAC 150 has an effective fixed sampling rate $F_s$. The term "effective" is used to define that the DAC may receive a signal input having a sample rate of $F_s$ or may receive multiple parallel inputs P, each with a sample rate of $F_s/P$, such that in combination the sampling rate processed by the DAC is $F_s$. The DAC 150 receives a discrete time signal output from the quadrature modulator 140 and converts it to a continuous time signal. When considering the frequency domain, this process also generates images of the spectrum occurring between DC and $F_s$ repeatedly in the positive and negative frequency directions. More specifically, the spectrum of DC to $F_s$ is repeated in the positive frequency direction between $F_s$ and $2F_s$, $2F_s$ and $3F_s$, etc. and in the negative frequency direction between 0 and $-F_s$, $-F_s$ and $-2F_s$, $-2F_s$ and $-3F_s$, etc.

Figure 3:
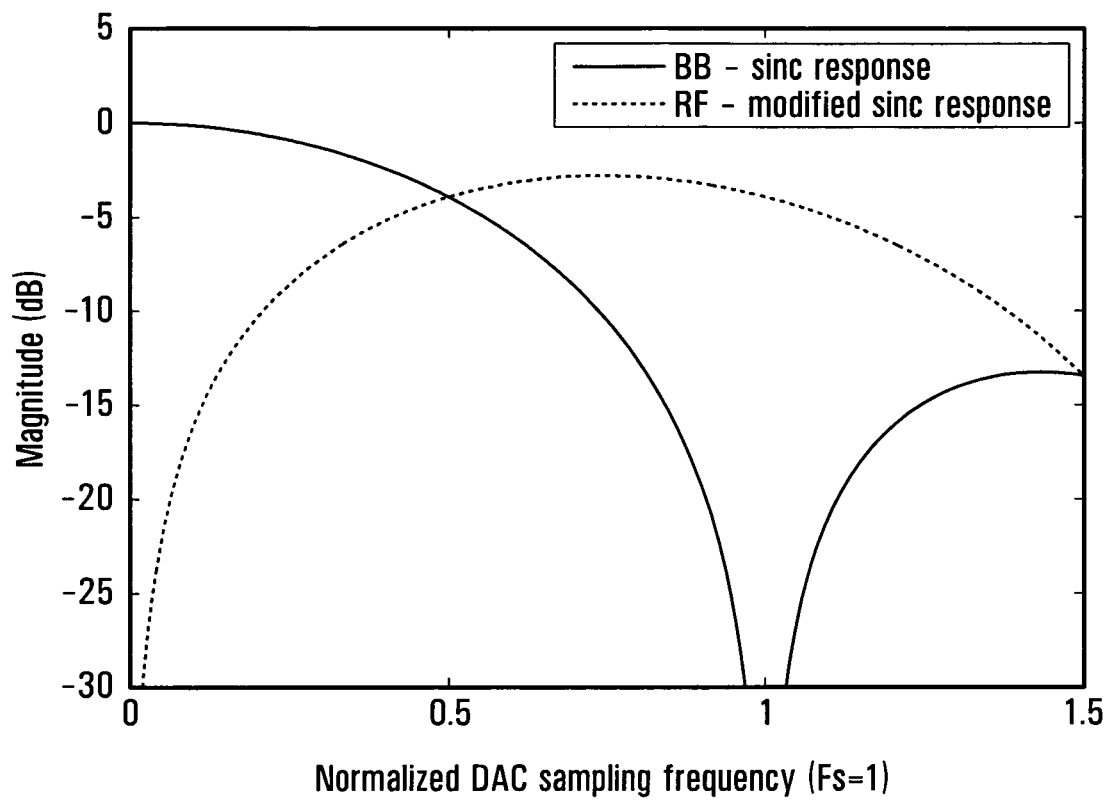
FIG. 3 is a graphical plot of a comparison of frequency responses for different operating modes of a digital-to-analog converter used in embodiments of the invention.

The DAC 150 may be operated in a baseband mode if it is desired to up-convert the signal to a location in the first Nyquist zone. A DAC operated in the baseband mode has a frequency response that produces a useful output in the first Nyquist zone. If the DAC supports an RF mode then the digital up-converter can be used to up-convert the signal in either of the second or third Nyquist zones. In some embodiments, a DAC that supports an RF mode can do so due to a configurable output stage adapted to modify the frequency response of the DAC in the second and third Nyquist zones to be amenable to operation in these zones. The zone that is targeted will depend on one or more factors, such as, but not limited to, the desired up-conversion frequency, the maximum sample rate of the DAC, the performance capabilities of the DAC, and the overall desired performance of the up-converter. FIG. 3 illustrates an example of a normalized comparison of frequency responses for a DAC operated in baseband mode (solid line) and a DAC operated in RF mode (dashed line).

FIG. 2F illustrates a frequency spectrum output of the DAC 150 in which the output of the digital quadrature modulator 140 of FIG. 2E 250,260, occurring between DC and $F_s$ is replicated between $F_s$ and $2F_s$ as indicted by references 270, 280. Additional images occur at higher frequencies, but are not shown. It is noted that images in the second and fourth Nyquist zones 260,280 are spectrally reversed with respect to the original baseband signal.

The post-DAC filter 160 receives a continuous time signal from the DAC 150. The post-DAC filter 160 cleans-up the continuous signal, such that in the frequency domain an image located at the desired up-converted frequency is selected and other undesired images are attenuated. The location of the selected image at the desired frequency may be below the sampling rate $F_s$ of the DAC, for example in either the first or second Nyquist zones, or above the sampling rate $F_s$, that is in the third or higher Nyquist zones.

In some embodiments, the post-DAC filter 160 is an analog filter for selecting and filtering the frequency spectrum output from the DAC 150 to reduce signal interference with other images of the complex baseband signal.

In some embodiments, re-sampling is performed to modify the sampling rate of the input complex baseband signal frequency to be a sub-multiple of the DAC sampling rate by adding a rate change filter in the chain of components 110, 120, 130, 140. For example, the sampling rate of the input baseband signal may be such that an integer factor of up-sampling does not result in a sampling rate that provides optimal processing by the DAC. To obtain a sampling rate $F_s$ that may be preferred for the DAC a rate change filter allows the sampling rate of the input baseband signal to be changed to an integer sub-multiple of the fixed effective sampling rate of the DAC, prior to being input to the DAC. The integer sub-multiple can be equal to or greater than 1. As opposed to being placed prior to the baseband complex tuner, the rate change filter could be located elsewhere in the chain of components illustrated in FIG. 1. Referring to FIG. 1, the rate change filter could be located at any one of the following locations: subsequent to complex baseband tuner 110; subsequent to digital up-sampler 120; subsequent to image selection filter 130; subsequent to digital quadrature modulator 140; or prior to DAC 150. In some embodiments, multiple rate change filters could be used, such that the combination of rate change filters up-sample the discrete-time baseband signal to be an integer sub-multiple of the fixed effective sampling rate of the DAC prior to being input to the DAC, where the integer sub-multiple can be equal to or greater than 1. When the rate change filter is located elsewhere it may be more complicated to implement as changing the sampling rate of the signal may be done at a higher sampling frequency than the input baseband signal sampling rate. Ultimately, as long as an input to the DAC is at fixed DAC sampling rate $F_s$, the sampling rates elsewhere in the chain need not be explicitly as described with regard to FIGS. 1 and 2 above.

Furthermore, while the above description specifically describes outputs of each of the components 110, 120, 130, 140, 150 being received by subsequent components in the chain, it is to be understood that other components may be included in the chain, for example the rate change filter, and such inclusion of other components is considered to be within the scope of the invention. In some implementations, the components may be in a different order than shown in FIG. 1, as will be described in further detail below.

In some embodiments, some or all of the components in the digital up-converter described above, i.e. complex baseband tuner, digital up-sampler, image selection filter and/or modulator, are implemented using a field programmable gate array (FPGA). While an FPGA is one example of a manner the components of the digital up-converter may be implemented, other digital processing techniques are contemplated. In some embodiments, an FPGA may be used for implementing some of the components and different implementation techniques may be used for other components. In some embodiments, the components may be implemented as individual devices that are cascaded together. In some embodiments the components may be implemented such that two or more components are implemented together and two or more such combined groups of components are cascaded together.

With knowledge of the desired up-conversion frequency and the fixed rate sampling rate of the DAC for use in the digital up-converter as a starting point, it is possible to determine operating parameters for the baseband complex tuner and image selection filter that enable one or both of these components to be configured to produce an image at the desired frequency to be used as the up-converted version of the input baseband signal. In a situation in which the input baseband signal has a sample rate of $F_s/N$, knowing the desired up-conversion frequency enables an amount of tuning to be determined that will position the tuned baseband signal at a location that when up-sampled by N will result in an image at a desired location. In addition, determining which image to select with the image selection filter enables filter coefficients to be determined that will result in the selection of that image and attenuation of undesired images. Once the amount of tuning and the filter coefficients are determined, complex baseband tuner and image selection filter operational parameters can be provided to the respective components to configure the components. As a result, the complex baseband tuner is used to shift the position of the baseband input signal anywhere in the range of $-F_s/2N$ to $F_s/2N$. Following up-sampling by the digital up-sampler, the image selection filter selects an appropriate image based on the filter coefficients provided to the image selection filter. Further processing is performed as required, including some or all of modulating the output of the selected image, converting the complex signal to a real signal, converting the discrete signal to a continuous time signal and performing selection of the image at the desired up-converted frequency.

In an embodiment that includes a quadrature modulator having a quadrature modulation frequency $f_{qmod}$, if $f_{target}$ is a desired center frequency and $F_s$ is the DAC sampling rate, Eq. 1 and Eq. 2 or Eq. 3 and Eq. 4 (below) can be used to calculate the desired frequency tuning of a prototype low pass filter ($f_{filtertuning}$) to perform image selection and to calculate the baseband complex tuning frequency ($f_{BBtune}$).

if $(f_{target} - f_{qmod}) \geq 0$  Eq. 1
$$f_{filtertuning} = \mod(f_{target} - f_{qmod}, F_s)$$

if $f_{filtertuning} \geq 0$  Eq. 2
$$f_{BBtune} = \mod\left(f_{filtertuning}, \frac{F_s}{N}\right)$$

if $(f_{target} - f_{qmod}) < 0$  Eq. 3
$$f_{filtertuning} = (\mod(f_{target} - f_{qmod} + F_s, F_s)) - F_s$$

if $f_{filtertuning} < 0$  Eq. 4
$$f_{BBtune} = \left(\mod\left(f_{filtertuning}, \frac{F_s}{N}, \frac{F_s}{N}\right)\right) - \frac{F_s}{N}$$

Practically, complex tuners are implemented to tune over a range of $-F_{sample}/2$ to $F_{sample}/2$, where $F_{sample}$ is the rate of operation of the complex tuner. If the result of Eq. 2 or Eq. 4 is greater than abs ($F_{sample}/2$) it can be converted to the range of the above by subtracting $F_{sample}$.

In some embodiments, the digital up-sampler and the image selection filter are implemented together as a polyphase filter which performs both the up-sampling and filtering processes in a computationally efficient manner.

In general terms, a polyphase filter performs partitioning of the input signal into L phases (where L is equal to the up-sampling factor N). L inputs are filtered using L different "sub-filters" or "filter phases" derived from an overall filter that would be otherwise used to perform filtering of the signal as a whole. In some embodiments, a total number of taps T for the overall filter is a multiple of L, and generally a number of taps per sub-filter is three or more. However, any number of taps may be used to provide a desired filtering function. The coefficients of each sub-filter are determined by skipping every Lth coefficient, starting at coefficients zero through L-1. An output of the polyphase filter may be formed by recombining the constituent L phase outputs to generate the output at a higher sampling rate (L times the input sampling rate) or may be formed by maintaining the constituent L phase outputs as separate parallel paths. Values for L, the number of taps per sub-filter and coefficient selection that would be used in a polyphase filter are considered to be implementation specific parameters.

A particular example of a polyphase filtering process in which the constituent L phase outputs are maintained as separate parallel paths is described in U.S. Pat. No. 6,987,953, which is assigned to the assignee of the present application, and is hereby incorporated by reference in its entirety. Other polyphase filtering techniques beyond those specifically disclosed in U.S. Pat. No. 6,987,953, for example where constituent L phase outputs are recombined, are also contemplated.

In some embodiments, a digital quadrature modulator could be implemented subsequent to, and in combination with, a polyphase filter. Such an implementation may result in further hardware simplification if the quadrature modulation frequency is selected to be the DAC sample rate divided by an integer value (e.g. $F_s/4$). Further hardware simplification may occur if the integer (e.g. 4) has an integer relation to the up-sampling rate (e.g. N=4, 8, etc.). This restriction reduces the combined polyphase filter/quadrature modulator complexity substantially with no impact on the tuning flexibility. A particular example of such a combined polyphase filter/quadrature modulator is also described in U.S. Pat. No. 6,987,953.

Figure 7A:
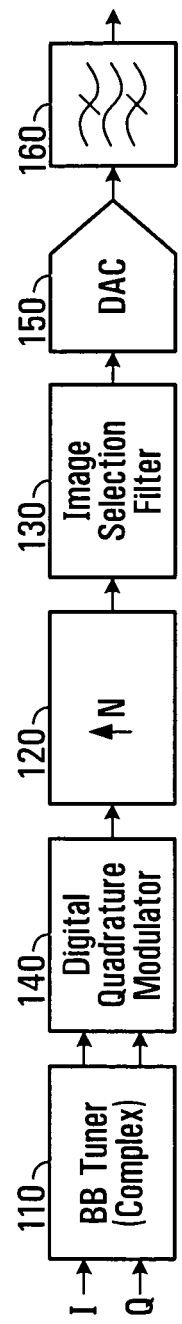
FIGS. 7A and 7B are block diagrams of apparatuses for digitally up-converting a signal according to embodiments of the invention.

In some embodiments of the invention the combination of components forming the up-converter may not be implemented in the particular arrangement illustrated in FIG. 1. For example, in some embodiments of the invention, instead of being located subsequent to the image select filter 130 and prior to the DAC 150, the digital quadrature modulator 140 may be implemented subsequent to the baseband complex tuner 110 and prior to the digital up-sampler 120. As a result, $f_{qmod}$ would be a lower frequency, but could still be selected so as to simplify the hardware implementation of the up-converter. FIG. 7A illustrates an example of such an implementation in which the real output of digital modulator 140 results in only a single stream to digital up-sampler 120 and a single output from up-sample by N up-sampler 120 to image selection filter 130.

Figure 7B:
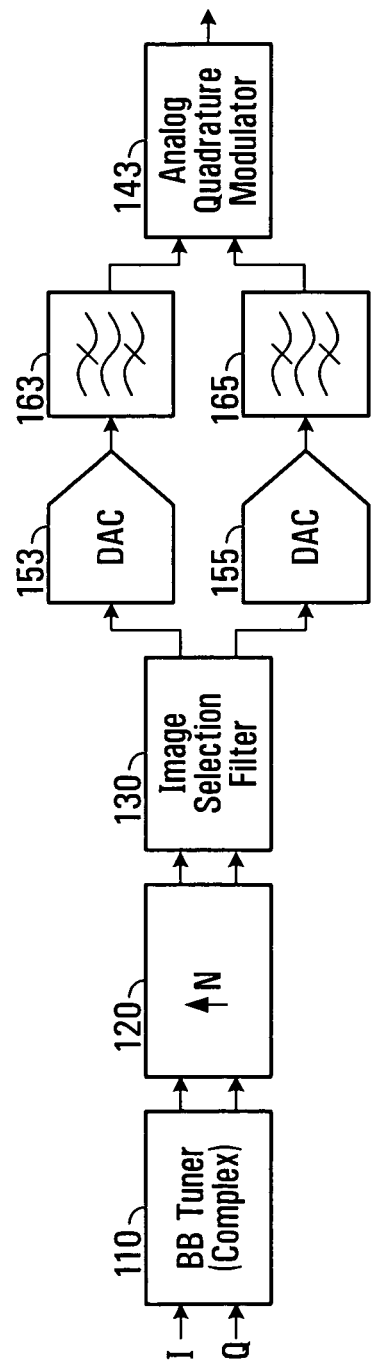

Furthermore, in some embodiments, instead of using a digital quadrature modulator, an analog quadrature modulator could be used in the up-converter. Such an analog quadrature modulator would be located subsequent to the DAC so as to perform analog quadrature modulation on a continuous-time output of the DAC. Such an implementation would require having two DACs, one for each of the I and Q streams output from the image selection filter, as well as two post-DAC filters, one for each of the streams. FIG. 7B illustrates an example implementation in which each output of the image selection filter 130 is input to a respective DAC 153,155. The outputs of the respective DACs 153,155 are provided to respective post-DAC filters 163,165. The outputs of the respective post-DAC filters 163,165 are provided as I and Q streams to a single analog quadrature modulator 143.

Figure 4:
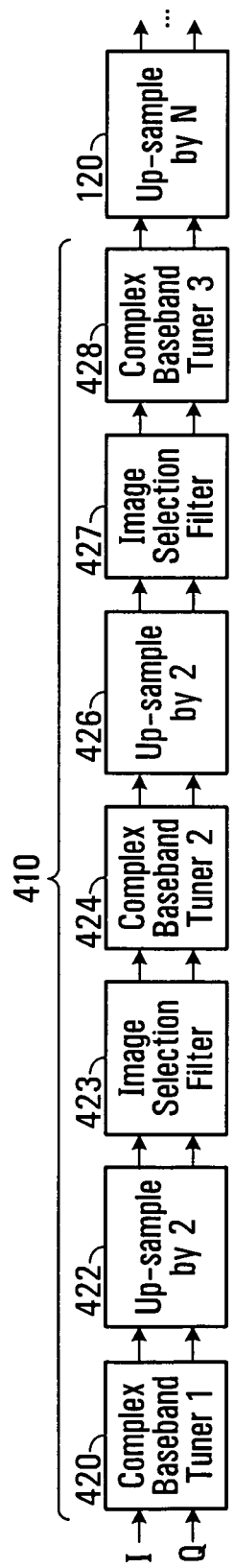
FIG. 4 is a block diagram of an example of a distributed baseband complex tuner in accordance with an aspect of the invention.

In some embodiments, the complex tuner is implemented in a distributed manner. An example of a distributed complex tuner will now be described with reference to FIG. 4. The distributed complex tuner is collectively identified by reference 410, and is implemented by a chain of components, each component being a complex tuner, a digital up-sampler or an image selection filter. The digital up-samplers shown in FIG. 4 are up-sample by 2 up-samplers. More generally, the digital up-samplers in the distributed complex tuner could be up-sample by N up-samplers, where N>=2. Subsequent to each up-sampler, a respective image selection filter is used to select a desirable image in the frequency domain from the multiple images that are generated by up-sampling. In some embodiments, such an image selection filter may be similar to the image selection filter described above. For example, the image selection filter is a programmable filter than can be configured to operate with a desirable response.

In FIG. 4 a first complex baseband tuner 420 receives a complex input and provides an output to a first up-sample by 2 up-sampler 422. An output of the first up-sample by 2 up-sampler 422 is provided to the first image selection filter 423. A second complex baseband tuner 424 receives an output from the first image selection filter 423 and provides an output to a second up-sample by 2 up-sampler 426. An output of the second up-sample by 2 up-sampler 426 is provided to the second image selection filter 427. A third complex baseband tuner 428 receives an output from the second image selection filter 427 and provides an output to an up-sample by N up-sampler, which in the illustrated example is the same as up-sample by N up-sampler 120 in FIG. 1.

In operation, the output of each up-sample by 2 up-sampler 422,426 is supplied to a respective image selection filter 423,427, in which undesired images in the frequency domain are attenuated. The output of each image selection filter 423, 427 is supplied to a respective subsequent complex baseband tuner 424,428 in the chain. In the illustrated example, each complex tuner 420, 424, 428 produces an interim amount of frequency up-conversion, which collectively result in an output that is equivalent to the frequency up-conversion of an output of the complex baseband tuner 110 in FIG. 1. Such an implementation may enable the digital up-converter to achieve improved resolution at lower sample rates with lower complexity. In some embodiments, the output of the distributed complex tuner may not be $F_s/N$, as described with respect to FIG. 1. In such a case the output could be re-sampled to a desired sample frequency.

The example of FIG. 4 is a particular implementation for illustrative purposes. The number of complex baseband tuners, digital up-samplers, and image selection filters is implementation specific. More generally, the distributed complex tuner has M, M>=2, complex baseband tuners, M−1 digital up-samplers and M−1 image selection filters. M−1 of the M complex baseband tuners the M−1 digital up-samplers and the M−1 image selection filters are arranged in groups of a complex baseband tuner, a digital up-sampler and an image selection filter. Each group is configured to perform complex tuning of a discrete-time signal to produce an interim tuned discrete-time signal, up-sampling of the interim tuned discrete-time signal to produce an up-sampled interim tuned discrete-time signal and filtering of the up-sampled interim tuned discrete-time signal to select to an image and produce a filtered interim tuned discrete-time signal. The first group operates on the input discrete-time baseband signal and each subsequent group operates on the resulting filtered interim tuned discrete-time of each previous group. The Mth complex tuner is then configured to receive the M−1th filtered interim tuned discrete-time signal and perform complex tuning of the M−1th filtered interim tuned discrete-time signal to produce a complex tuned discrete-time signal.

In some embodiments, the up-sampling factor used for the digital up-sampler of each group may be the same for each group. In some embodiments, the up-sampling factor may be the same for some groups, but different for other groups. In some embodiments, the up-sampling factor may be different for each group.

A general method of performing digital up-conversion for which the input baseband signal has a sampling rate $F_s/N$ will now be described with reference to FIG. 5. The method is performed for a given complex baseband signal for which a DAC having a known effective fixed sampling rate $F_s$ is used to convert a discrete up-converted baseband signal to a continuous time signal. Complex tuning parameters and image selection filter coefficients can be determined based on a desired up-conversion frequency for the complex baseband signal and the known fixed DAC sampling rate.

The first step 5-1 of the method involves selecting a fixed effective sampling rate $F_s$ for a digital-to-analog converter (DAC) used in up-converting the discrete-time baseband signal.

In a second step 5-2, the discrete-time complex baseband signal is tuned within a baseband bandwidth, thereby producing a complex-tuned discrete-time signal.

A third step 5-3 involves up-sampling the complex-tuned discrete-time signal. Up-sampling the complex-tuned discrete-time signal by N, where N>=2, to produce an up-sampled discrete-time signal having a frequency domain representation that includes N equally spaced apart images of the second discrete-time signal in a frequency spectrum between 0 and $F_s$. There is no spectral image reversal of the images of the up-sampled discrete-time signal due to the up-sampling process, just repetition of the frequency band representation of the complex-tuned discrete-time signal between 0 and $F_s$ across the frequency spectrum, i.e. in the positive frequency direction between $F_s$ and $2F_s$, $2F_s$ and $3F_s$, etc. and in the negative frequency direction between 0 and $-F_s$, $-F_s$ and $-2F_s$, $-2F_s$ and $-3F_s$, etc.

A fourth step 5-4 involves filtering the up-sampled discrete-time signal by selecting at least one image in the frequency domain of the up-sampled discrete-time signal to produce a filtered discrete-time signal.

A fifth step 5-5 involves digital quadrature modulating of the filtered discrete-time signal. In some embodiments, the digital quadrature modulating converts the signal from a complex discrete-time signal to a real discrete-time signal.

A sixth step 5-6 involves converting the real discrete-time signal to a real, continuous-time signal. In the frequency domain this conversion results in further images being produced with a repetition rate of $F_s$. In some embodiments the conversion is performed by a DAC. Such conversion may be implemented using any one or more of, but not limited to, a sample and hold process, a return to zero process, or other known conversion processes. In some embodiments, the limited complexity (e.g. sample and hold) of the conversion produces images that have been attenuated by the DAC frequency response.

A seventh step 5-7 involves cleaning-up the output of the continuous-time signal, which involves in the frequency domain, selecting an image located at the desired up-conversion frequency. This desired up-conversion frequency may be below or above the sampling rate $F_s$. In some embodiments such selection involves filtering which attenuates undesired images.

Additional method steps may also involve determining the amount of complex tuning for the performing complex tuning step and determining filter coefficients used in the filtering of the discrete-time signal step.

In some embodiments, determining an amount of complex tuning used in the performing complex tuning step and determining filter coefficients used in the filtering of the discrete-time signal step are each determined as a function of the fixed effective sampling rate of the DAC and the desired frequency of up-conversion.

If the sample rate of the input baseband signal is not $F_s/N$, then re-sampling may be performed at some point during the method to ensure that a signal input to the DAC has an effective sample rate of $F_s$. If the sample rate of the input baseband signal is not $F_s/N$, then there may not be N images in the bandwidth between 0 and $F_s$ as described in the example above, N images would occur between 0 Hz and the sample rate of the input baseband signal multiplied by N.

In some embodiments, up-sampling and image selection filtering are implemented together as a polyphase filtering process. In some embodiments, quadrature modulation is implemented subsequent to, and in combination with, the polyphase filtering process.

A further step that may be included in the method is re-sampling the input complex baseband signal supplied to the complex tuner, or the sampling rate of the signal somewhere during the method steps described above prior to the discrete time to continuous time conversion, to have a sampling frequency that is an integer sub-multiple of the effective fixed sampling rate of the discrete signal being converted to the continuous signal.

Figure 5:
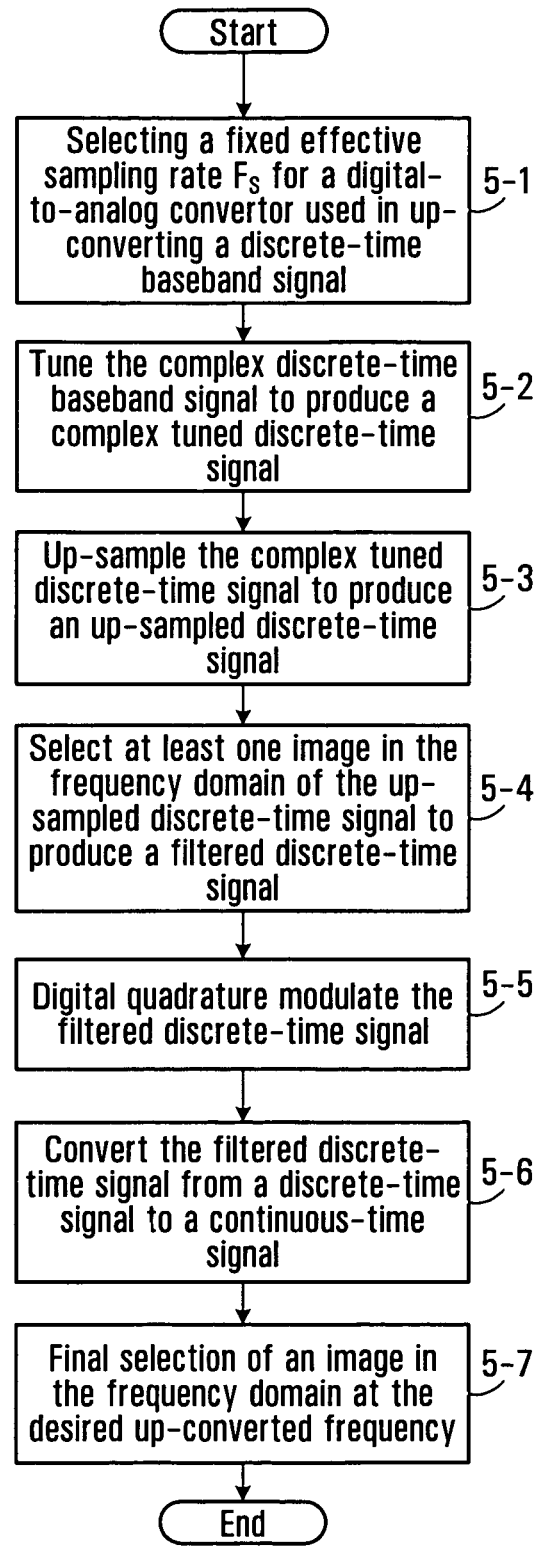
FIG. 5 is a flow chart illustrating an example of a method according to an embodiment of the invention.

In some embodiments of the invention, the steps described above for performing up-conversion may not be implemented in the particular order described and illustrated in FIG. 5. In some embodiments of the invention, digital quadrature modulation may be implemented subsequent to the baseband signal tuning of step 5-1 and prior to the up-sampling of step 5-2 instead of subsequent to the filtering of step 5-3 and prior to converting the discrete time signal to a real, continuous-time signal of step 5-4.

Furthermore, digital quadrature modulation may be replaced by analog quadrature modulation performed subsequent to the converting the discrete-time signal to a real, continuous-time signal. Such an implementation requires processing in parallel two streams, one for each of the I and Q signals of the complex signal subsequent to the filtering of step 5-4. Each of the streams is converted from a discrete-time signal to a continuous-time signal, filtered subsequent to conversion of the discrete-time signal to a continuous-time signal and the filtered signals are analog quadrature modulated.

As a result of the unique usage of complex tuning, the inherently repetitive nature of sampled signals, and programmable digital filtering, some embodiments of the method provide flexible digital up-conversion capable of tunability over a wide frequency range. Having such a wide frequency range of tunability, the method may be used for effectively rebanding a radio from one frequency band to another frequency band, in a manner that is not possible with conventional analog radios. Whereas conventional analog radios would typically need to be redesigned for a different band, a radio implementing some embodiments of the present invention can be easily reconfigured by providing the radio with information to change the operating parameters of one or more programmable components such that when the operating parameters are implemented the radio operates in the new band. The method may be used to reconfigure a radio which has been operating in one communication band to operate in a different communication band, without significant redesign of the components performing the up-conversion function. The radio may be effectively rebanded from a first communication band to a second other communication band. Examples of types of communication bands include, but are not limited to, UMTS bands; GSM bands; PCS bands; Whitespace bands; 3G bands; 4G bands; MediaFlo bands; AMPS bands; and DVB-H bands.

Figure 6:
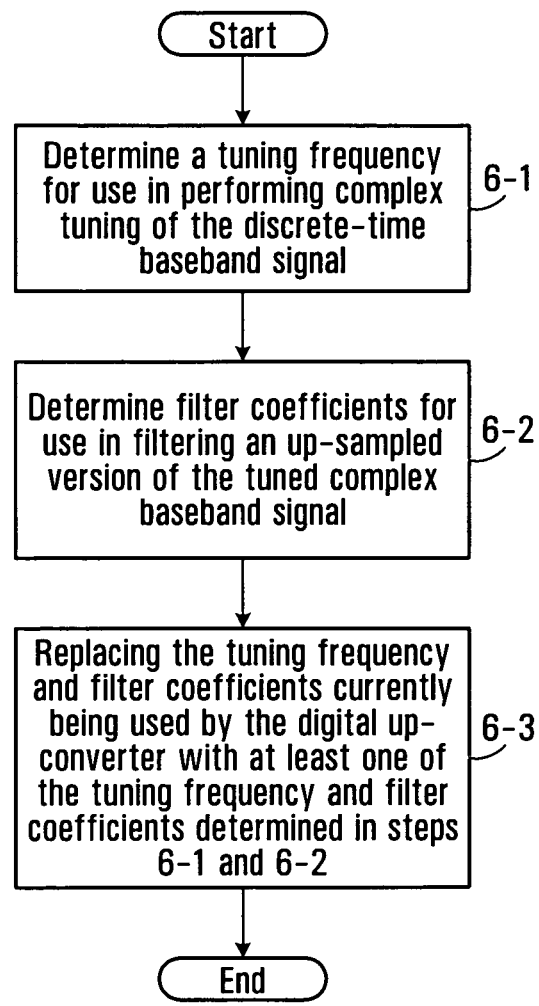
FIG. 6 is a flow chart illustrating an example of another method according to an embodiment of the invention.

Some embodiments of the invention provide methods for reconfiguring a digital up-converter to operate in a different frequency band. An example of such a method will now be described with respect to FIG. 6 for an up-converter that receives an input baseband signal having a sampling rate equal to $F_s/N$.

Based on knowledge of a desired up-conversion frequency in the different frequency band from a current up-conversion frequency and the selected fixed effective sampling rate of the DAC used in the digital up-converter, a first step 6-1 involves determining a tuning frequency for use in performing complex tuning of a discrete-time baseband signal to produce a complex-tuned discrete-time signal.

A second step 6-2 involves determining filter coefficients for use in filtering an up-sampled discrete-time signal that includes N, N>=2, images of the discrete-time baseband signal in the frequency domain between 0 and $F_s$, the up-sampled discrete-time signal resulting from up-sampling by N of the complex-tuned time-discrete signal, the filtering comprising selection of at least one image of the N images of the up-sampled discrete-time signal.

A third step 6-3 of the method involves replacing the tuning frequency and filter coefficients currently being used in the digital up-converter with at least one of the tuning frequency and filter coefficients determined in the respective determining steps.

In some embodiments, as the effective sample rate for the DAC in an up-converter is fixed, when a radio is reconfigured to operate in a different band, the sample rate of the DAC is maintained at the fixed sample rate and the tuning frequency and filter coefficients for the up-converter are determined based on the fixed effective sampling rate of the DAC and the desired frequency of up-conversion of the discrete-time baseband signal input to the up-converter.

If the sample rate of the input baseband signal is not $F_s/N$, then re-sampling may be performed at some point during the method to ensure that a signal input to the DAC has an effective sample rate of $F_s$. If the sample rate of the input baseband signal is not $F_s/N$, then there may not be N images in the bandwidth between 0 and $F_s$ as described in the example above, N images would occur between 0 Hz and the sample rate of the input baseband signal multiplied by N.

The methods and apparatus described herein may be used with any type of radio that may benefit from frequency up-conversion flexibility. In some embodiments, the methods and apparatus are implemented in a communications base station. In some embodiments, the methods and apparatus are implemented in a mobile station. Examples of a mobile station include, but are not limited to, a cellular telephone, a wireless enabled computer, a wireless enabled PDA, etc.

In some embodiments, the methods and apparatus described herein mitigate distortion caused by analog up-conversion techniques while providing a flexible up-conversion platform. As the inventive techniques described herein utilize digital processing, significant integration is possible which may reduce costs, transceiver size, and power requirements compared to traditional techniques.

The combination of implementing digital frequency tunability with a fixed DAC sample rate enables a radio with a digital up-converter according to embodiments of the invention to be reconfigured by simply supplying the radio with reconfiguration information to reconfigure operation of one or more programmable components of the radio. For example, this may include a few hundred bytes of configuration data to one or more of the components in the digital up-converter. These components may include, but are not limited to the complex baseband tuner, the image selection filter, or a polyphase filter configured to perform up-sampling and image selection. This manner of reconfiguration of the radio may result in a significant reduction in rebanding costs.

The inventive techniques lend themselves well to application specific integrated circuit (ASIC) integration as even after implementation a frequency of operation for a radio using a digital up-converter in accordance with embodiments of the invention is still fully programmable. Use of the inventive techniques also simplifies effective rebanding of a radio as in some embodiments, only final stages (for example power amplification and filtering) need significant physical modification to accommodate the rebanding to an alternate frequency band.

A particular example of an application where the methods and apparatus described herein may be applicable is the proposed use of unused spectrum, currently in place to avoid interference between bands in the UHF and VHF portions of the electromagnetic spectrum. This particular application is known as Whitespace.

In a Whitespace application, different geographical locations within a given country or landmass may have different allocations of such unused spectrum, reconfigurability of transceivers will be an important requirement as the available frequencies will vary with geographical location.

Numerous modifications and variations of the present invention are possible in light of the above teachings. It is therefore to be understood that within the scope of the appended claims, the invention may be practised otherwise than as specifically described herein.

The invention claimed is:

1. A method of digitally up-converting a discrete-time baseband signal to a desired frequency comprising:
   selecting a fixed effective sampling rate $F_s$ for a digital-to-analog converter (DAC) used in up-converting the discrete-time baseband signal;
   performing complex tuning on the discrete-time baseband signal to produce a complex tuned discrete-time signal which is translated in the frequency domain;
   up-sampling the complex tuned discrete-time signal by N, N is an integer>=2, to produce an up-sampled discrete-time signal having a frequency domain representation that includes a plurality of equally spaced apart images;
   filtering the up-sampled discrete-time signal to select at least one image of the plurality of images of the discrete-time signal to produce a filtered discrete-time signal;
   converting the filtered discrete-time signal that includes the at least one image to a continuous-time signal using the DAC; and
   filtering the continuous-time signal to select an image located at the desired frequency in the frequency domain;
   wherein an amount of tuning used in the performing complex tuning step and filter coefficients used in the filtering of the discrete-time signal step are each determined as a function of the fixed effective sampling rate of the DAC and the desired frequency of up-conversion.

2. The method of claim 1 further comprising:
   determining the amount of tuning for performing complex tuning;
   determining filter coefficients used in the filtering of the discrete-time signal.

3. The method of claim 1 further comprising:
   performing quadrature modulation subsequent to complex tuning.

4. The method of claim 3 wherein performing quadrature modulation subsequent to complex tuning comprises one of:
   performing digital quadrature modulation prior to converting the filtered discrete-time signal to a continuous-time signal; and
   performing analog quadrature modulation subsequent to converting the filtered discrete-time signal to a continuous-time signal.

5. The method of claim 3 wherein performing quadrature modulation subsequent to complex tuning comprises:
   performing digital quadrature modulation subsequent to filtering the up-sampled discrete-time signal.

6. The method of claim 1 wherein filtering the continuous-time signal comprises:
   selecting an image from the continuous-time signal located at a frequency between 0 and $F_s$; or
   selecting an image from the continuous-time signal located at a frequency above $F_s$.

7. The method of claim 1 wherein up-sampling the discrete-time signal by N and filtering the up-sampled discrete-time signal comprises performing the up-sampling and filtering using polyphase techniques.

8. The method of claim 5 wherein up-sampling the discrete-time signal by N and filtering the up-sampled discrete-time signal comprises performing the up-sampling and filtering using polyphase techniques, and wherein:
   performing digital quadrature modulation comprises using a quadrature modulation frequency which is equal to the fixed effective sampling rate of the DAC divided by an integer.

9. The method of claim 8 wherein the integer has an integer relation to N.

10. The method of claim 1 wherein performing complex tuning on the discrete-time baseband signal comprises:
    performing M times in succession, where M is an integer>=2, the first time on the discrete-time baseband signal and each subsequent time of the M times on a resulting discrete-time signal of each previous occurrence:
       complex tuning of a discrete-time signal to produce an interim tuned discrete-time signal;
       up-sampling the interim tuned discrete-time signal to produce an up-sampled interim tuned discrete-time signal;
       filtering the up-sampled interim tuned discrete-time signal to select an image in the frequency domain and produce a filtered interim tuned discrete-time signal;
    performing complex tuning on the Mth filtered interim tuned discrete-time signal to produce the up-sampled discrete-time signal.

11. The method of claim 1 further comprising resampling at least one of the discrete-time baseband signal, the complex tuned discrete-time signal, the up-sampled discrete-time signal or the filtered discrete-time signal to be an integer sub-multiple of the fixed effective sampling rate of the DAC.

12. An apparatus for performing digital up-conversion of a discrete-time baseband signal to a desired frequency, the apparatus comprising:
- a digital-to-analog converter (DAC) having a fixed effective sampling rate that is selected to be $F_s$;
- a complex tuner configured to tune the discrete-time baseband signal and produce a complex tuned discrete-time signal;
- a digital up-sampler configured to produce an up-sampled discrete-time signal by up-sampling the complex tuned discrete-time signal by N, N is an integer >=2, wherein the up-sampled discrete time signal includes a plurality of equally spaced apart images in the frequency domain;
- an image selection filter configured to select at least one image of the plurality of images and produce a filtered discrete-time baseband signal that is converted by the DAC from the discrete-time baseband signal to a continuous-time signal;
- a post-DAC filter configured to receive the continuous-time signal and select an image located at the desired frequency in the frequency domain;
- wherein an amount of tuning used in the complex tuner, and filter coefficients used in the image selection filter are each determined as a function of the selected fixed effective sampling rate of the DAC and the desired frequency of up-conversion.

13. The apparatus of claim 12 wherein the complex tuner and the image selection filter are configurable by changing operational parameters to digitally up-convert the discrete-time baseband signal to a desired frequency in any one of a plurality of communication bands.

14. The apparatus of claim 12 wherein the digital up-sample by N up-sampler and the image selection filter are implemented in a manner configured to perform polyphase techniques.

15. The apparatus of claim 12 further comprising:
- a quadrature modulator configured to perform quadrature modulation subsequent to the complex tuner.

16. The apparatus of claim 15 wherein the quadrature modulator comprises one of:
- a digital quadrature modulator configured to perform digital quadrature modulation prior to the DAC; and
- an analog quadrature modulator configured to perform analog quadrature modulation subsequent to the DAC.

17. The apparatus of claim 15 wherein the digital up-sample by N up-sampler and the image selection filter are implemented in a manner configured to perform polyphase techniques; and
- wherein the quadrature modulator is a digital quadrature modulator configured to perform digital quadrature modulation prior to the DAC and operate at a quadrature modulation frequency which reduces the complexity of the implementation.

18. The apparatus of claim 12 wherein the complex tuner is a distributed complex tuner having M, M is an integer>=2, complex baseband tuners, M−1 digital up-samplers and M−1 image selection filters:
- wherein M−1 of the M baseband tuners, the M−1 digital up-samplers and the M−1 image selection filters are arranged in groups of a baseband tuner, a digital up-sampler and an image selection filter, each group configured to perform:
  - complex tuning of a discrete-time signal to produce an interim tuned discrete-time signal;
  - up-sampling of the interim tuned discrete-time signal to produce an up-sampled interim tuned discrete-time signal; and
  - filtering of the up-sampled interim tuned discrete-time signal to select an image and produce a filtered interim tuned discrete-time signal;
  - the first group performing on the discrete-time baseband signal and each subsequent group performing on the resulting filtered interim tuned discrete-time signal of each previous group; and
- the Mth complex tuner configured to:
- receive the M−1th filtered interim tuned discrete-time signal; and
- perform complex tuning of the M−1th filtered interim tuned discrete-time signal to produce the complex tuned discrete-time signal.

19. The apparatus of claim 12 further comprising a rate change component adapted to resample at least one of the discrete-time baseband signal, the complex-tuned discrete-time signal, the up-sampled discrete-time signal or the filtered discrete-time signal to be an integer sub-multiple of the fixed effective sampling rate of the DAC.

20. A method of reconfiguring a digital up-converter to operate in a different frequency band, the method comprising:
- determining a tuning frequency for use in performing complex tuning of a discrete-time baseband signal to produce a complex-tuned discrete-time signal;
- determining filter coefficients for use in filtering an up-sampled discrete-time signal to isolate at least one image in the frequency domain of a plurality of images of the up-sampled discrete-time signal and produce a filtered discrete-time signal, the up-sampled discrete-time signal resulting from up-sampling the complex tuned time-discrete signal;
- wherein determining the tuning frequency and determining the filter coefficients comprise determining the tuning frequency and the filter coefficients as a function of:
  - a fixed effective sampling rate of a digital-to-analog converter (DAC) used in the digital up-converter; and
  - a desired frequency of up-conversion of the discrete-time baseband signal.

21. The method of claim 20 further comprising:
- replacing the tuning frequency and filter coefficients currently being used in the digital up-converter with at least one of the tuning frequency and filter coefficients determined in the respective determining steps.

* * * * *